United States Patent
Lyons et al.

(10) Patent No.: US 7,122,455 B1
(45) Date of Patent: Oct. 17, 2006

(54) PATTERNING WITH RIGID ORGANIC UNDER-LAYER

(75) Inventors: Christopher F. Lyons, Fremont, CA (US); Marina V. Plat, San Jose, CA (US); Srikanteswara Dakshina-Murthy, Wappingers Falls, NY (US); Scott A. Bell, San Jose, CA (US); Cyrus E. Tabery, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 145 days.

(21) Appl. No.: 10/790,567

(22) Filed: Mar. 1, 2004

(51) Int. Cl.
*H01L 21/3205* (2006.01)

(52) U.S. Cl. ............ 438/585; 438/197; 438/694; 438/942; 438/947; 257/E21.023

(58) Field of Classification Search ........ 438/585, 438/197, 694, 942, 947
See application file for complete search history.

(56) References Cited

U.S. PATENT DOCUMENTS

| | | | | |
|---|---|---|---|---|
| 5,965,461 A | * | 10/1999 | Yang et al. | 438/717 |
| 6,010,829 A | * | 1/2000 | Rogers et al. | 430/316 |
| 6,214,637 B1 | * | 4/2001 | Kim et al. | 438/72 |
| 6,420,097 B1 | * | 7/2002 | Pike et al. | 430/313 |
| 6,794,230 B1 | * | 9/2004 | Huang et al. | 438/154 |
| 6,933,227 B1 | * | 8/2005 | Adetutu et al. | 438/636 |
| 6,936,539 B1 | * | 8/2005 | Yin et al. | 438/689 |
| 6,939,794 B1 | * | 9/2005 | Yin et al. | 438/624 |

* cited by examiner

*Primary Examiner*—Michael Trinh
*Assistant Examiner*—Christy Novacek
(74) *Attorney, Agent, or Firm*—Monica H. Choi

(57) ABSTRACT

For patterning an IC (integrated circuit) material, a rigid organic under-layer is formed over the IC material, and the rigid organic under-layer is patterned to form a rigid organic mask structure. In addition, the rigid organic mask structure is trimmed to lower a critical dimension of the rigid organic mask structure beyond the limitations of traditional BARC mask structures. Any portion of the IC material not under the rigid organic mask structure is etched away to form an IC structure.

9 Claims, 5 Drawing Sheets

US 7,122,455 B1

PATTERNING WITH RIGID ORGANIC UNDER-LAYER

TECHNICAL FIELD

The present invention relates generally to integrated circuit fabrication, and more particularly, to patterning an IC (integrated circuit) material using a rigid organic under-layer for achieving critical dimensions beyond traditional photolithography limitations.

BACKGROUND OF THE INVENTION

Referring to FIG. 1, for patterning an IC (integrated circuit) material 102 formed on a semiconductor substrate 104, a BARC (bottom anti-reflective coating) layer 106 and a photo-resist layer 108 are formed on the IC material 102. Referring to FIGS. 1 and 2, a photolithography process is performed to pattern the photo-resist layer 108 to form a photo-resist mask structure 110 having a first critical dimension 112.

Referring to FIGS. 2 and 3, any portion of the BARC layer 106 not under the photo-resist mask structure 110 is etched away to form a BARC mask structure 114. During the etching process for forming the BARC mask structure 114, the exposed portions of the photo-resist mask structure 110 are also etched away. Thus, the photo-resist mask structure 110 and the BARC mask structure 114 in FIG. 3 have a second critical dimension 116 that is less than the first critical dimension 112 in FIG. 2.

During the photolithography process for patterning the photo-resist layer 108, the traditional BARC layer 106 is under the photo-resist layer 108 and is opaque to the light used in the photolithography process. Typically, the IC material 102 is reflective to the light used in the photolithography process. Such reflection during the photolithography process would disadvantageously distort the patterning of the photo-resist layer 108. Thus, the opaque BARC layer 106 is used under the photo-resist layer 108 for enhancing pattern transfer to the photo-resist layer 108 during the photolithography process.

For higher speed performance of integrated circuits, the critical dimension of an integrated circuit structure is desired to be minimized. The first critical dimension 112 is bounded by photolithography limitations for patterning the photo-resist layer 108 to form the photo-resist mask structure 110. In FIG. 3, the BARC mask structure 114 and the photo-resist mask structure 110 are trimmed to the second critical dimension 116 beyond the limitations for such a first critical dimension 112.

However, the second critical dimension 116 is also limited by a maximum possible aspect ratio of the photo-resist mask structure 110 and the BARC mask structure 114. The traditional photo-resist material and the traditional BARC material are relatively soft materials. Thus, at a maximum aspect ratio (i.e., a ratio of height 118 to the critical dimension 116), the photo-resist mask structure 110 and the BARC mask structure 114 disadvantageously deform in shape such as by toppling over for example.

In addition, the traditional BARC material is optimized for coating and optical properties. Thus, the traditional BARC material has poor etch selectivity during etching of the IC material 102 which may be polysilicon for example. In that case, the BARC mask structure 114 is prone to be further etched during etching of the IC material 102. The critical dimension 116 of the BARC mask structure 114 is designed to be high enough to not be significantly etched away during etching of the portions of the IC material 102. Thus, the critical dimension 116 of the BARC mask structure 114 is further limited by such poor etch selectivity of the traditional BARC material.

Nevertheless, the critical dimension of any mask structure above the IC material 102 is desired to be minimized for in turn minimizing the critical dimension of the IC structure to attain high speed performance of integrated circuits.

SUMMARY OF THE INVENTION

Accordingly, in a general aspect of the present invention, a rigid organic under-layer is used for minimizing the critical dimension of mask structures beyond that possible with the traditional BARC layer.

In one embodiment of the present invention, for patterning an IC (integrated circuit) material, a rigid organic under-layer is formed over the IC material, and the rigid organic under-layer is patterned to form a rigid organic mask structure. In addition, the rigid organic mask structure is trimmed to lower a critical dimension of the rigid organic mask structure. Any portion of the IC material not under the rigid organic mask structure is etched away to form an IC structure.

In another embodiment of the present invention, the step of patterning the rigid organic under-layer includes the step of forming a layer of photo-resist on the rigid organic under-layer. The photo-resist is patterned in a photolithography process, and any portion of the rigid organic under-layer not under the photo-resist is etched away. In a further embodiment of the present invention, the rigid organic under-layer is opaque to light used in the photolithography process for patterning the photoresist to act as a BARC (bottom anti-reflective coating).

In yet another embodiment of the present invention, a hard-mask layer is formed between the IC material and the rigid organic under-layer. Any portion of the hard-mask layer not under the rigid organic mask structure is etched away to form a hard-mask structure. In addition, any portion of the IC material not under the hard-mask structure is etched away to form the IC structure.

The rigid organic under-layer is comprised of material having high rigidity and high etch selectivity during etching of a material below. Examples of such material for the rigid organic under-layer are an aromatic addition polymer, an aromatic condensation polymer, or a non-aromatic crystalline polymer. Alternatively, the rigid organic under-layer is comprised of a carbon film deposited using one of methane, ethane, ethylene, propane, or propylene, in a CVD (chemical vapor deposition) process.

In this manner, because the rigid organic under-layer has such favorable mechanical and etch properties, the rigid organic mask structure has a critical dimension that is minimized beyond that possible with the traditional BARC material. Such a further minimized critical dimension advantageously enhances the speed performance of an integrated circuit fabricated with such a rigid organic mask structure.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, 12, and 13 refer to elements having similar structure and function.

DETAILED DESCRIPTION

Figure 4:
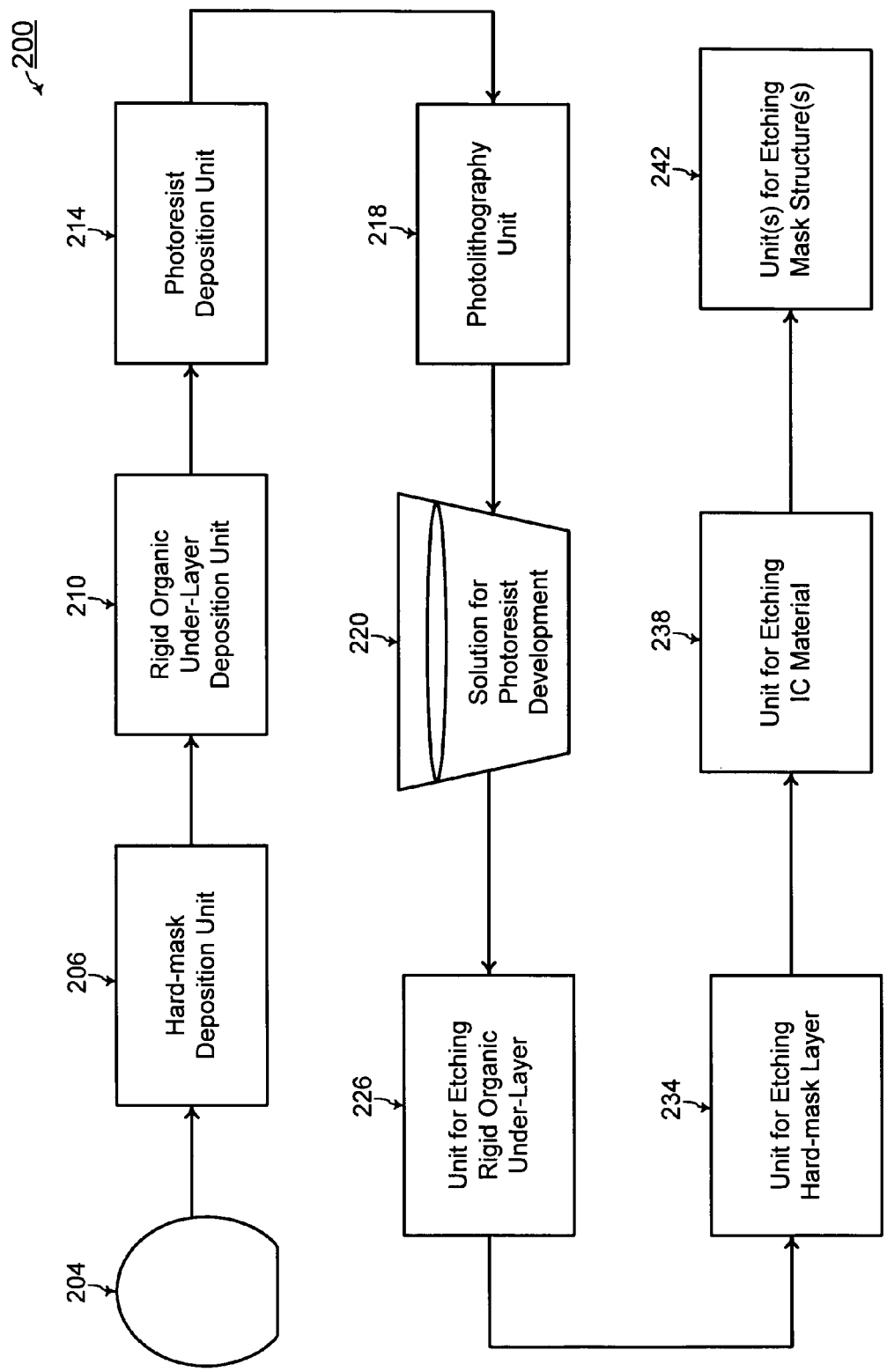
FIG. 4 shows components of a system for patterning mask structures using a rigid organic under-layer, according to an embodiment of the present invention.
Figure 5:
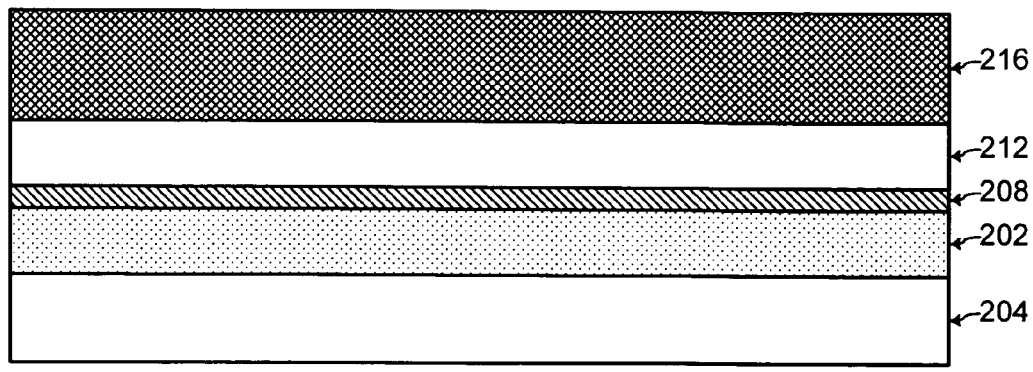
FIGS. 5–13 show cross-sectional views for patterning mask structures using the rigid organic under-layer within the system of FIG. 4, according to an embodiment of the present invention.

FIG. 4 illustrates a system 200 for forming mask structures with a rigid organic under-layer for patterning an IC (integrated circuit) material, according to an embodiment of the present invention. Referring to FIG. 5, an IC material 202 to be patterned is deposited on a semiconductor substrate 204. The semiconductor substrate 204 is comprised of a silicon wafer according to one embodiment of the present invention.

The IC material 202 is any material patterned for forming an integrated circuit such as polysilicon for forming a gate of a MOSFET (metal oxide semiconductor field effect transistor) for example. In that case, the IC material 202 is deposited with an example thickness range of from about 500 Å (angstroms) to about 2,500 Å, in one embodiment of the present invention. Processes for depositing IC material to be patterned in general are individually known to one of ordinary skill in the art.

Referring to FIGS. 4 and 5, the semiconductor substrate 204 having the IC material 202 deposited thereon is processed through a hard-mask deposition unit 206 for depositing a hard-mask layer 208 on the IC material 202. The hard-mask layer 208 is comprised of silicon nitride (SiN) according to one embodiment of the present invention. In that case, the hard-mask layer 208 is deposited with an example thickness range of from about 100 Å to about 700 Å, in one embodiment of the present invention. A hard-mask deposition unit for depositing SiN in general is individually known to one of ordinary skill in the art.

In addition, the semiconductor substrate 204 having the IC material 202 and the hard-mask layer 208 deposited thereon is processed through a rigid organic under-layer deposition unit 210 for depositing a rigid organic under-layer 212 on the hard-mask layer 208. The rigid organic under-layer 212 is generally defined herein as being comprised of an organic material having higher rigidity than traditional BARC (bottom anti-reflective coating) materials.

An example material for such a rigid organic under-layer 212 includes aromatic addition polymers such as polystyrene, substituted polystyrenes, and copolymers of styrene with other ethylenic unsaturated monomers. Another example material for the rigid organic under-layer 212 includes aromatic condensation polymers such as phenol-formaldehyde resins and polyimides, polyamides, and polycarbonates. In general, highly cross-linked polymers provide mechanical and etching properties advantageous for the present invention.

In addition, the rigid organic under-layer 212 may be comprised of non-aromatic crystalline polymers such as high density polyethylene and high density polypropylene. Alternatively, the rigid organic under-layer deposition unit 210 may be a CVD (chemical vapor deposition) unit for depositing a carbon film from methane, ethane, propane, propylene, and the like.

Such example materials for the rigid organic under-layer 212 and a deposition unit for depositing such example materials in general are individually known to one of ordinary skill in the art. For such example materials, the rigid organic under-layer 212 is deposited with an example thickness range of from about 500 Å to about 5,000 Å, in one embodiment of the present invention.

Further referring to FIGS. 4 and 5, the semiconductor substrate 204 having the IC material 202, the hard-mask layer 208, and the rigid organic under-layer 212 deposited thereon is processed through a photoresist deposition unit 214 for depositing a photoresist layer 216 on the rigid organic under-layer 212. The photoresist layer 216 is deposited with an example thickness range of from about 1,000 Å to about 5,000 Å, in one embodiment of the present invention. A photoresist deposition unit for depositing photoresist in general is individually known to one of ordinary skill in the art.

Figure 6:
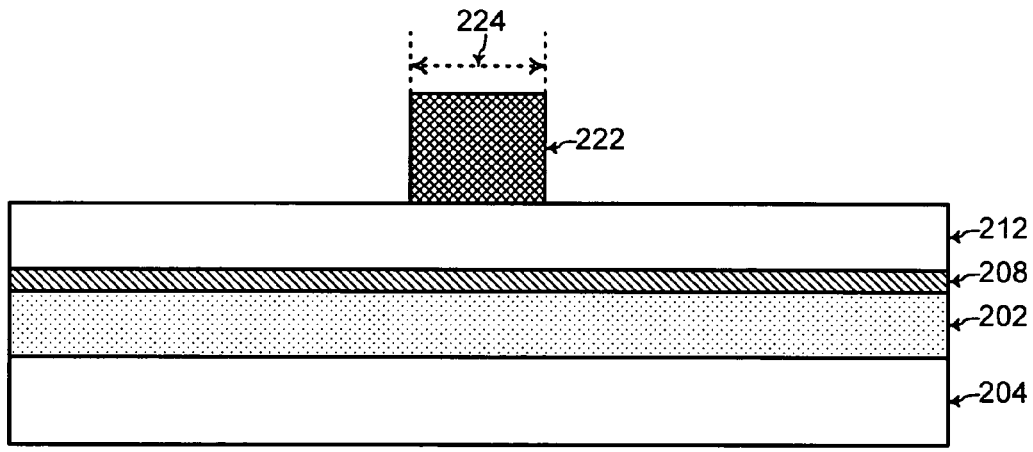

Referring to FIGS. 4, 5, and 6, the semiconductor substrate 204 having the IC material 202, the hard-mask layer 208, the rigid organic under-layer 212, and the photoresist layer 216 deposited thereon is processed through a photolithography unit 218. Within the photolithography unit 218, a light source is used to expose the photoresist layer 216 according to a pattern as defined by a reticle. After such exposure, the semiconductor substrate 204 is processed through a solution for photoresist development 220 to form a photoresist mask structure 222. A photolithography unit and solution for photoresist development for pattern transfer from a reticle to a photoresist layer are in general individually known to one of ordinary skill in the art.

In one embodiment of the present invention, the rigid organic under-layer 212 is opaque to the light used in the photolithography unit 218 for patterning the photoresist layer 216. In that case, the rigid organic under-layer 212 advantageously acts as a BARC (bottom anti-reflective coating) to enhance pattern transfer from the reticle within the photolithography unit 218 to the photoresist layer 216.

However, the present invention may also be practiced when the rigid organic under-layer 212 is transparent or semitransparent to the light used in the photolithography unit 218 for patterning the photoresist layer 216. For example, the present invention may be practiced with such a rigid organic under-layer 212 that is transparent or semi-transparent when the layer beneath the rigid organic under-layer 212 is not as reflective to the light used in the photolithography unit 218 for patterning the photoresist layer 216.

Further referring to FIG. 6, the photoresist mask structure 222 has a first critical dimension 224. Minimization of the first critical dimension 224 is bounded by the limitations of the photolithography unit 218. Typical limitations of photolithography units are known to one of ordinary skill in the art. However, minimizing the critical dimension of an integrated circuit structure as much as possible is desired for higher speed performance of integrated circuits.

Figure 7:
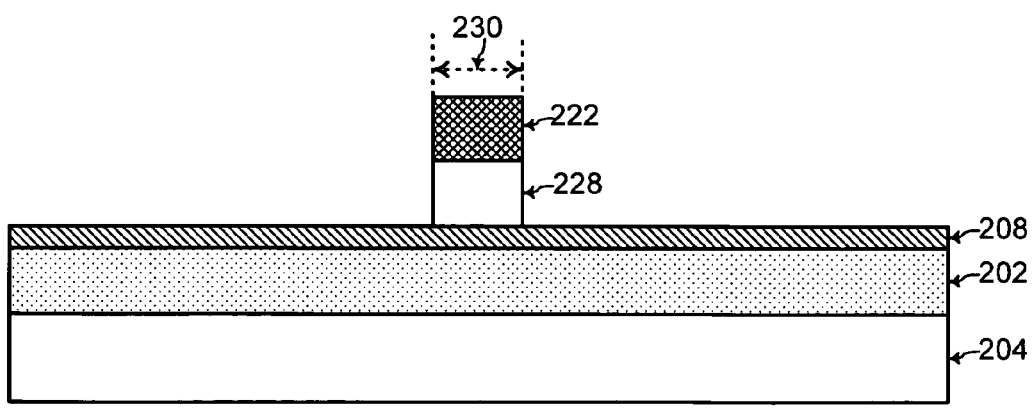

Referring to FIGS. 4, 6, and 7, after formation of the photoresist mask structure 222, the semiconductor substrate 204 is processed through a unit 226 for etching away any exposed region of the rigid organic under-layer 212 to form a rigid organic mask structure 228. Units for etching away any exposed region of example materials of the rigid organic under-layer 212 as described herein are in general individually known to one of ordinary skill in the art. For example, the unit 226 may use an etching solution or may use a gas-phase etching agent such as in a plasma etch or a reactive ion etch.

Figure 8:
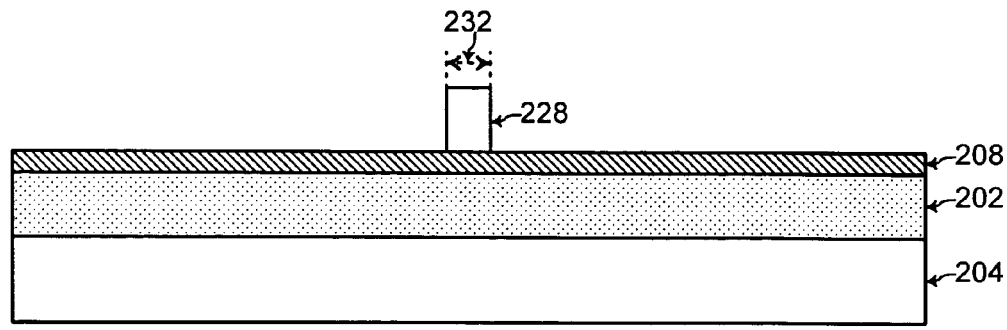

Further referring to FIG. 7, within the unit 226 for etching the rigid organic under-layer 212, exposed surfaces of the photoresist mask structure 222 and the exposed sidewalls of the rigid organic mask structure 228 are etched to achieve a second critical dimension 230 in FIG. 7 that is lower than the first critical dimension 224 of the photoresist mask structure 222 in FIG. 6. Referring to FIGS. 7 and 8, the amount of time that such mask structures 222 and 228 are exposed to etching agent(s) within the unit 226 for etching the rigid organic under-layer 212 is controlled to achieve a final critical dimension 232 of the rigid organic mask structure 228.

Figure 9:
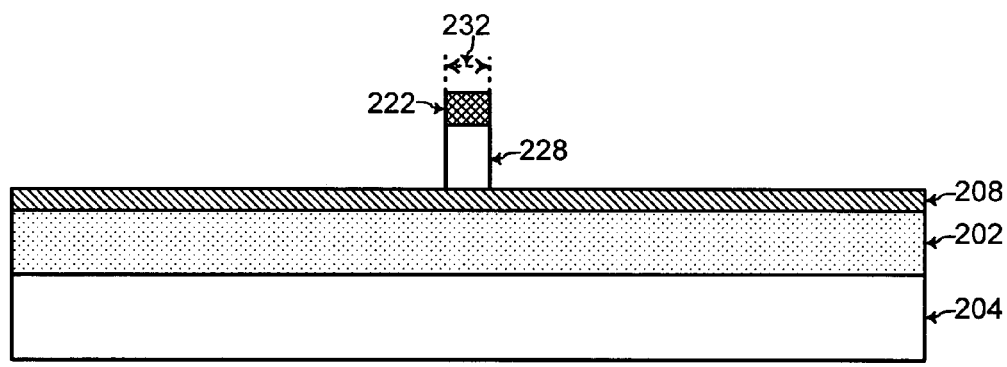

In FIG. 8, the photoresist mask structure 222 is completely stripped away from top of the rigid organic mask structure 228 by the time the final critical dimension 232 is achieved. Alternatively, in FIG. 9, the present invention may also be practiced when a portion of the photoresist mask structure 222 remains on top of the rigid organic mask structure 228 by the time the final critical dimension 232 is achieved.

Figure 1:
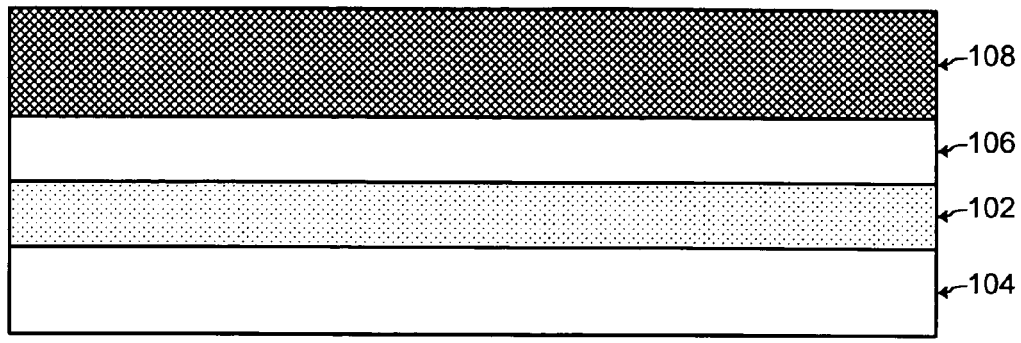
FIGS. 1–3 shows cross-sectional views for patterning mask structures using photoresist and traditional BARC (bottom anti-reflective coating) material, according to the prior art.
Figure 2:
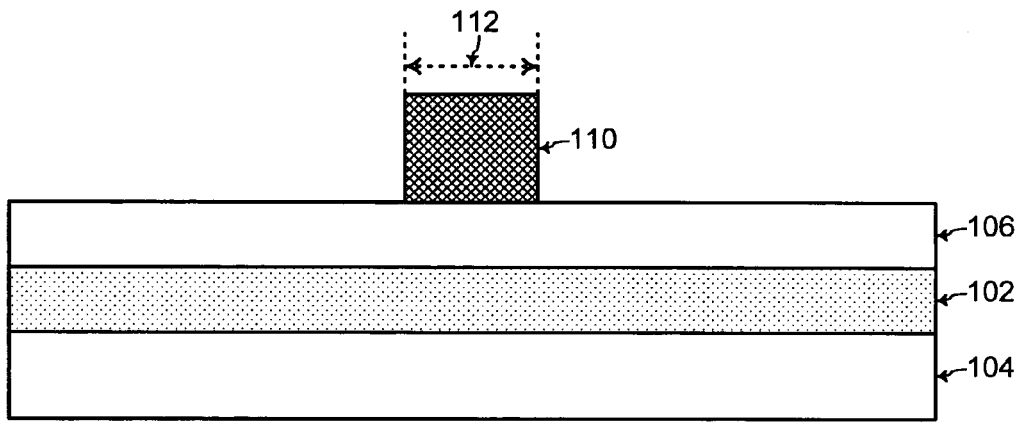
Figure 3:
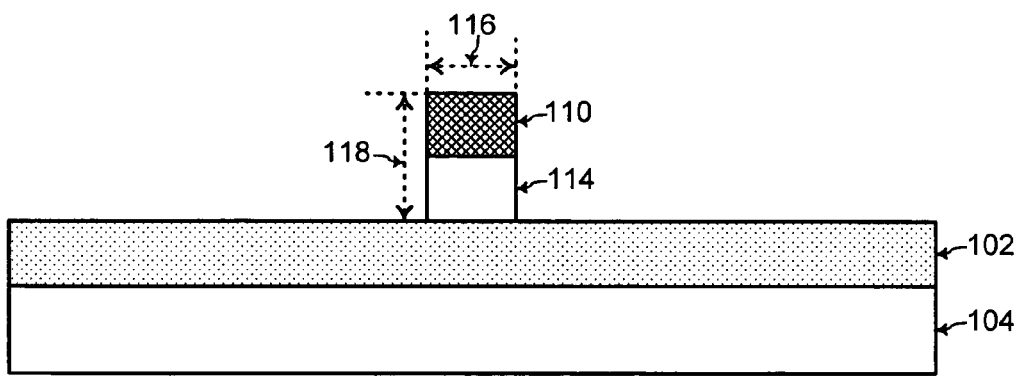

In any case, the final critical dimension 232 of the rigid organic mask structure 228 is lower than possible in the prior art because the rigid organic mask structure 228 is comprised of a material that is more rigid than the traditional BARC layer 106 in FIGS. 1, 2, and 3. In FIG. 3, the critical dimension 116 that is achievable after trimming of the BARC mask structure 114 is in a range of from about 50 nanometers to about 250 nanometers in the prior art. In contrast, in the present invention of FIG. 8 or 9, the final critical dimension 232 of the rigid organic mask structure 228 may be as low as 10 nanometers and certainly less than 50 nanometers.

Figure 10:
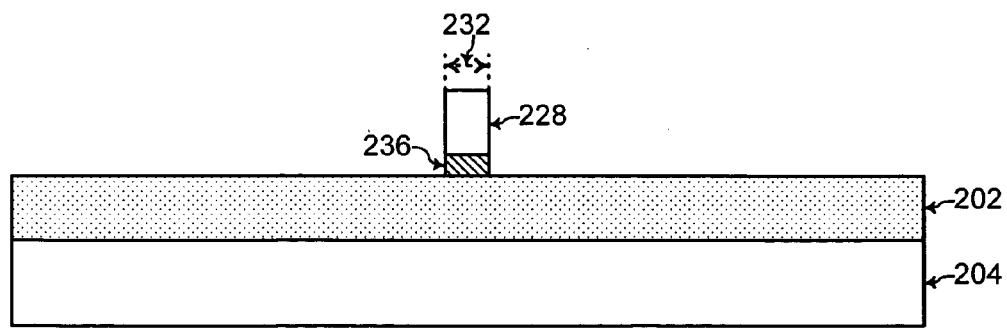

Referring to FIGS. 4, 8, and 10, after the rigid organic mask structure 228 is trimmed to have the final critical dimension 232, the semiconductor substrate 204 is processed through a unit 234 for etching away any exposed region of the hard-mask layer 208 to form a hard-mask structure 236. Units for etching away any exposed region of the hard-mask layer 208 which may be comprised of silicon nitride (SiN) for example are in general individually known to one of ordinary skill in the art. For example, the unit 234 may use an etching solution or may use a gas-phase etching agent such as in a plasma etch or a reactive ion etch.

Figure 11:
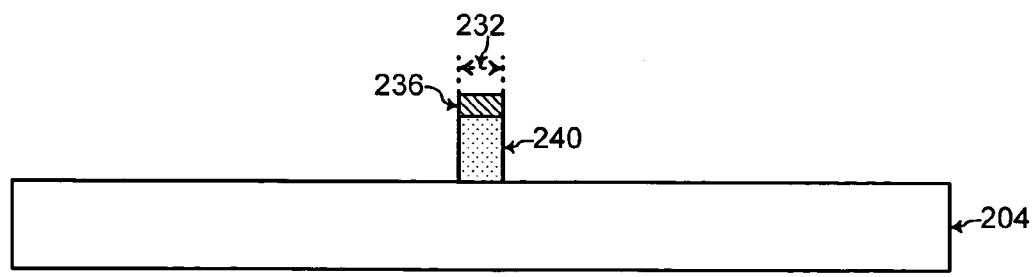

Referring to FIGS. 4, 10, and 11, after formation of the hard-mask structure 236, the semiconductor substrate 204 is processed through a unit 238 for etching away any exposed region of the IC material 202 to form an IC structure 240. Units for etching away any exposed region of the IC material 202 which may be comprised of polysilicon for example are in general individually known to one of ordinary skill in the art. For example, the unit 238 may use an etching solution or may use a gas-phase etching agent such as in a plasma etch or a reactive ion etch.

Figure 12:
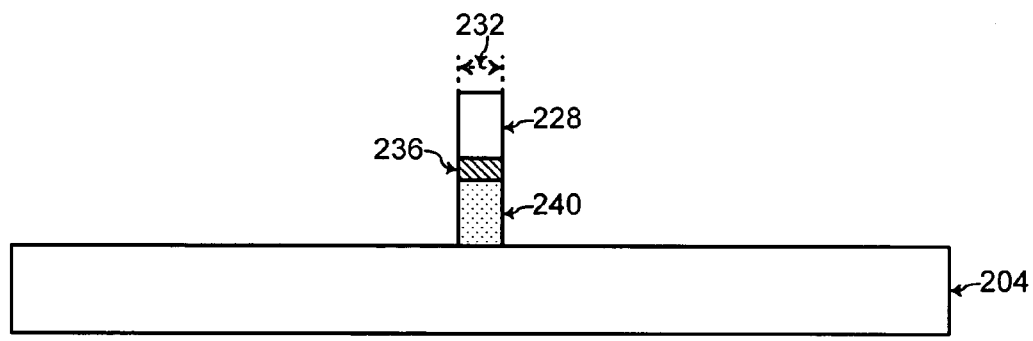

Depending on the material comprising the rigid organic mask structure 228, the rigid organic mask structure 228 may be completely stripped away from top of the hard-mask structure 236 within the unit 238 for etching the IC material 202 (as illustrated in FIG. 11). Alternatively, depending on the material comprising the rigid organic mask structure 228, the rigid organic mask structure 228 may remain on top of the hard-mask structure 236 after the IC structure 240 is formed (as illustrated in FIG. 12).

In any case, the material of the rigid organic mask structure 228 is formed to have high etch selectivity from the material of the hard-mask layer 208. Thus, during etching of the hard-mask layer 208 for formation of the hard-mask structure 228, the final critical dimension 232 of the rigid organic mask structure 228 is substantially preserved. Thus, the rigid organic mask structure 228 may be trimmed to a lower final critical dimension 232 in FIG. 8 since the rigid organic mask structure 228 is not etched away during formation of the hard-mask structure 236. The hard-mask structure 236 is then used to pattern the IC material 202 to form the IC structure 240.

In contrast, referring to FIG. 3 of the prior art, the BARC mask structure 114 has poor etch selectivity with the IC material 102. The BARC mask structure 114 is etched away during etching of the IC material 102 to form the IC structure. Thus, the BARC mask structure 114 is trimmed to a higher critical dimension 116 since portions of the BARC mask structure 114 are expected to be etched away during etching of the IC material 102. Such low etch selectivity between the BARC mask structure 114 and the IC material 102 limits the critical dimension 116 of the BARC mask structure 114 in FIG. 3.

Note that the present invention may be practiced with or without the hard-mask layer 208 and the hard-mask structure 236. For example, the material of the rigid organic under-layer 212 may be chosen to have a high etch selectivity from the IC material 202 within the unit 238 for etching the IC material 202. In that case, the rigid organic mask structure 228 is formed directly on the IC material 202 and acts as a mask within the unit 238 for etching the IC material 202 such that the IC structure 240 is formed directly under the rigid organic mask structure 228. In this alternative embodiment, the hard-mask layer 208, the hard-mask structure 236, and the unit 234 for etching the hard-mask layer 208 are not used.

Figure 13:
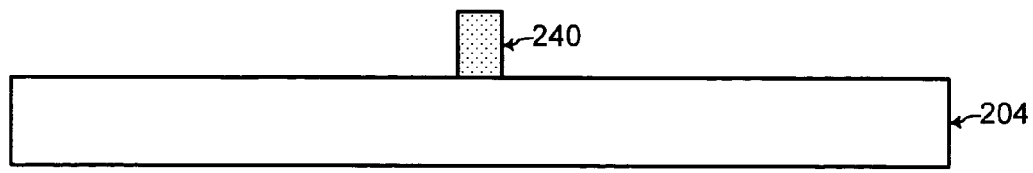

In any case, referring to FIGS. 4 and 13, any of the mask structures 236 or 228 remaining over the IC structure 240 is etched away within unit(s) 242 for etching away any remaining mask structure 236 and/or 228. Unit(s) for etching away any remaining mask structure 236 and/or 228 are in general individually known to one of ordinary skill in the art. For example, the unit(s) 242 may use an etching solution or may use a gas-phase etching agent such as in a plasma etch or a reactive ion etch.

In this manner, because the material of the rigid organic mask structure 228 is chosen for favorable mechanical and etch properties, the rigid organic mask structure 228 may be trimmed to the final critical dimension 232 that is minimized beyond that possible with traditional BARC materials. Such a minimized final critical dimension 232 advantageously enhances the speed performance of the integrated circuit fabricated with the rigid organic mask structure 228.

The foregoing is by way of example only and is not intended to be limiting. For example, the present invention is in reference to example layers of material 202, 208, 212, and 216 deposited directly on top of each-other. However, the present invention may be practiced with other intervening layers of material. Thus, when a first layer is described as being deposited on, over, or under a second layer, any number of intervening layers may also be formed between the first and second layers. In addition, the materials described herein for the layers 202, 208, 212, and 216 are by way of example only. Furthermore, any dimensions specified herein are by way of example only. The present invention is limited only as defined in the following claims and equivalents thereof.

We claim:

1. A method for patterning an IC (integrated circuit) material, comprising:
   forming a rigid organic under-layer over the IC material;
   patterning the rigid organic under-layer to form a rigid organic mask structure with a photo-resist mask structure there-over;
   trimming the rigid organic mask structure to lower a critical dimension of the rigid organic mask structure, wherein the photo-resist mask structure is completely etched away during the trimming; and
   etching away any portion of the IC material not under the rigid organic mask structure after the step of trimming the rigid organic mask structure.

2. The method of claim 1, wherein the step of patterning the rigid organic under-layer includes the steps of:
   forming a layer of photo-resist on the rigid organic under-layer;
   patterning the photo-resist in a photolithography process to form the photo-resist mask structure; and
   etching away any portion of the rigid organic under-layer not under the photo-resist to form the rigid organic mask structure.

3. The method of claim 2, wherein the rigid organic under-layer is opaque to light used in the photolithography process to act as a BARC (bottom anti-reflective coating) during patterning of the photo-resist.

4. The method of claim 2, wherein the rigid organic under-layer is transparent or semi-transparent to light used in the photolithography process.

5. The method of claim 1, further comprising:
   forming a hard-mask layer between the IC material and the rigid organic under-layer;
   etching away any portion of the hard-mask layer not under the rigid organic mask structure to form a hard-mask structure; and
   etching away any portion of the IC material not under the hard-mask structure.

6. The method of claim 5, wherein material of the rigid organic under-layer remains on top of the hard-mask structure.

7. The method of claim 5, wherein material of the rigid organic under-layer is completely stripped away from top of the hard-mask structure.

8. The method of claim 1, wherein the rigid organic under-layer is comprised of one of an aromatic addition polymer, an aromatic condensation polymer, or a non-aromatic crystalline polymer; or a carbon film deposited using one of methane, ethane, ethylene, propane, or propylene, in a CVD (chemical vapor deposition) process.

9. The method of claim 1, wherein the critical dimension of the rigid organic mask structure is trimmed to be in a range of from about 10 nanometers to less than about 50 nanometers.

* * * * *